WARM UP NOISE SILENCER

Filed Nov. 4, 1957 2 Sheets-Sheet 1

INVENTOR.
Theodore A. Byles
BY Mueller & Aichele
Attys.

WARM UP NOISE SILENCER

Filed Nov. 4, 1957 2 Sheets-Sheet 2

INVENTOR.
Theodore A. Byles
BY Mueller & Aichele
Attys.

United States Patent Office 2,946,014

Patented July 19, 1960

2,946,014

WARM UP NOISE SILENCER

Theodore A. Byles, Villa Park, Ill., assignor to Motorola, Inc., Chicago, Ill., a corporation of Illinois Filed Nov. 4, 1957, Ser. No. 694,168

5 Claims. (Cl. 330—3)

This invention relates generally to radio receivers, and more particularly to apparatus for holding automobile radio receivers using both tubes and transistors silent during the initial warm up period.

Automobile radio receivers currently being used are largely of the hybrid type which include tube stages and one or more transistor stages which provide the audio output of the receiver. As these stages are coupled directly to the battery generator electrical system of the automobile, they are adversely affected by various noise sources present in the system, one of which is the breaker points of the automobile ignition system. Pulsating signals of variable frequency are developed in the ignition system as the breaker points open and close, and these signals are superimposed on the power supply for the receiver. Such signals, when applied to the speaker of the receiver, cause audible noise.

Hybrid receivers usually include simple power supply filtering means, such as a choke coil and a capacitor coupled to the automobile electrical system. These do not completely eliminate the noise, however, even when they include undesirably large and expensive components. An effective and inexpensive noise balancing suppressor suitable for use in hybrid receivers is described in the copending application of Frederick P. Hill, Serial No. 617,775, filed October 23, 1956, and owned by the assignee of this invention. This noise suppressor balances noise signals picked up in the receiver and appearing in the audio stages thereof against noise signals in the power supply so that the noise is cancelled out. This cancellation is not effective, however, until the receiver has warmed up and the thermionic tubes included therein are conducting. Since the transistor audio stages can conduct as soon as the receiver is turned on, noise signals in the power supply are picked up in these stages and are transmitted to the speaker without effective cancellation, thereby producing undesirable audible noise.

It is an object of this invention to provide a new and improved noise silencer for radio receivers which is effective during the warm up period.

Another object of the invention is to provide an audio system for automobile radio receivers including both tube and transistor stages in which noise is eliminated during the warm up period required by the tube or tubes of the receiver.

Still another object of the invention is to provide an improved transistor audio output stage for a hybrid automobile radio receiver in which a transistor device is disabled to silence the receiver output until the tubes have warmed up, thereby eliminating warm up noise.

A feature of the invention is the provision of an improved hybrid radio receiver including a transistor audio output stage having a delay circuit coupled to the biasing network thereof for cutting off the output for a time during which the receiver warms up.

A further feature of the invention is the provision of a bias delay circuit for the transistor output stage of a hybrid radio receiver energized from a voltage source including noise components, in which a thermionic diode holds the transistor device cut off until the diode conducts current. The diode has the same warm up characteristics as other thermionic electron discharge devices included in the receiver and may be provided in the same envelope with one of them.

A still further feature of the invention is the provision of an improved transistor audio output stage for a hybrid automobile radio receiver including a bias delay circuit coupled to the transistor of the output stage for silencing the receiver until it has warmed up, and also including noise compensating coils for cancelling out noise picked up in the receiver after it has warmed up.

The invention is illustrated in the drawings in which.

In accordance with the invention, automobile radio receivers of the hybrid type are provided with a transistor audio output stage having a bias delay circuit for cutting off the output stage while the receiver warms up. This eliminates noise which would otherwise appear in the output of the receiver, since such noise is present in the power supply for the receiver. One source of noise is the breaker points of the automobile ignition system which is connected to the battery-generator voltage source of the automobile in parallel with the receiver. Since the low voltage vacuum tubes and transistors used in hybrid receivers are coupled directly to the voltage source through only partially effective filtering means, noise components in the power supply are applied to the tubes and transistors of the receiver. Although these noise components are not reproduced in the tube stages until they have warmed up, they are reproduced in the transistor stages as soon as the receiver is turned on. The bias delay circuit includes a thermionic diode coupled to the bias network of the transistor so that the transistor is not biased to conduct until the diode warms up. The diode is selected so that it warms up at the same time as the tube stages, and the receiver is therefore effectively silenced until the tube stages become operative. A noise compensating coil may also be provided to balance noise picked up in the receiver after it warms up against noise in the power supply, with these noise components cancelling each other out.

Figure 1:
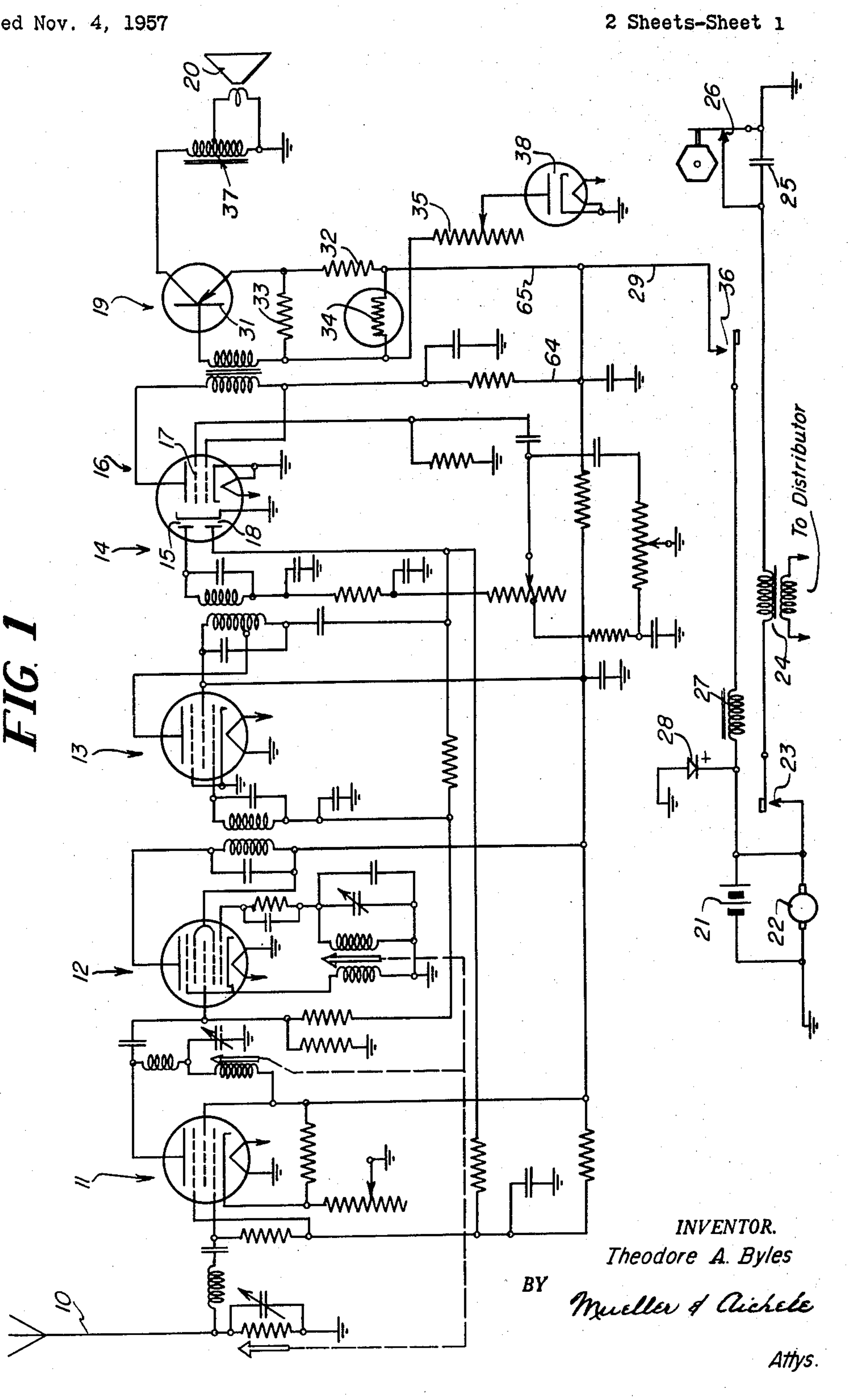
Fig. 1 shows the circuit of an automobile radio receiver including a bias delay circuit forming one embodiment of the invention.

In practicing the invention there is provided a hybrid radio receiver such as that shown in the circuit diagram of Fig. 1, including an antenna 10 which receives radio frequency signals having audio frequency modulation components and applies them to the radio frequency amplifier stage 11. The amplified signal is heterodyned in a well-known manner in a converter stage 12 to provide an intermediate frequency signal. This signal is amplified by the intermediate frequency amplifier 13, and the amplified signal is demodulated by the detector stage 14 to provide the audio frequency component. The resulting audio signal is applied to the audio amplifier stage 16 which includes a tetrode 17 enclosed in the same tube with the diode 15 of the detector stage. Another diode 18, forming a part of an automatic gain control circuit, is also included in this same tube. The amplified audio signal is coupled to a transistor output amplifier stage 19, and the output signal thereof is supplied to the loudspeaker 20 which converts it to sound energy.

The entire receiver is supplied with B+ power by the battery 21 and the generator 22 of the automobile which, though nominally rated as a 12 volt D.C. voltage source, actually supplies a direct current voltage which varies within a range of about 11 to 15 volts. The ignition system of the vehicle, including the ignition switch 23, the transformer 24, the capacitor 25, and the breaker points 26, is coupled to the voltage source in parallel with the receiver. As the breaker points 26 open and close during operation of the vehicle, pulsating signals of variable frequency are created in the power supply line leading to the receiver. These pulsating signals produce noise in the receiver output and are called noise signals. The filter network, composed of choke coil 27 and diode 28, serves to diminish the noise signals, but does not completely remove them from the line 29 connected to the receiver.

The D.C. power is applied as a B+ biasing potential to the transistor device 31 of the output amplifier stage 19 by the bias network comprising resistors 32, 33, 34 and 35 which are connected as a voltage divider. If the resistor 35 were returned directly to ground, the transistor device would be biased for conduction as soon as the on-off switch 36 is closed to turn the receiver on. Therefore, the noise signals in the power supply would be conducted through the transistor device 31 and applied by the transformer 37 to the loudspeaker 20 which would convert them to undesirable audible noise.

According to the invention the resistor 35 is returned to ground through the thermionic diode 38 which in this embodiment of the invention is provided in a separate tube. The diode 38 is selected so that it requires the same amount of time to warm up as do the other tubes included in stages 11, 12, 13, 14 and 16. During the warm up period for the receiver when no audio signal is being applied to the output amplifier stage 19, the diode 38 does not conduct current, and consequently the transistor device 31 is not biased properly for conduction. Thus, the receiver is effectively silenced so that no noise is applied to the loudspeaker 20. Since the diode 38 and the other tubes in the receiver warm up at substantially the same time, noise begins to appear in the output of the receiver simultaneously with desired audio signals. These audio signals tend to cover up the noise picked up in the output stage so that this noise becomes less objectionable.

Figures 2, 3:
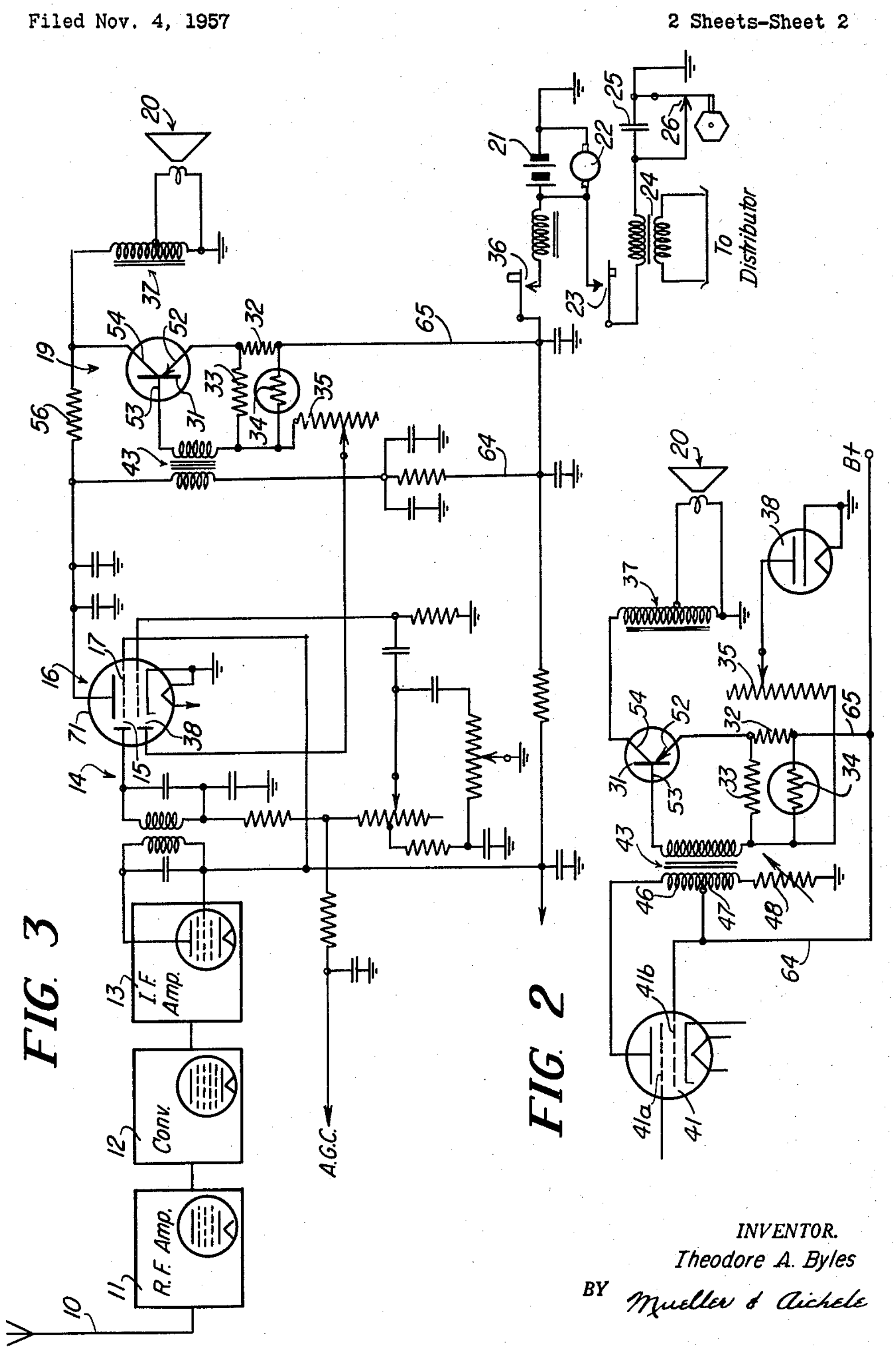
Fig. 2 shows the circuit of the transistor audio output portion for a radio receiver which includes a warm up silencer circuit and a noise suppressor circuit forming another embodiment of the invention.
Fig. 3 shows the circuit of an automobile radio receiver including a bias delay circuit forming still another embodiment of the invention.

After the warm up period of the receiver, noise signals are also picked up in the tube stages, and such noise signals are amplified by the output stage 19 before being applied to the loudspeaker. It may be desirable to provide a noise suppression circuit to remove such noise, and Fig. 2 shows the output portion of a receiver in which such a circuit is provided. The circuit includes a tetrode 41 in a vacuum tube and a transistor device 31. The tetrode 41 may be part of an audio amplifier stage such as the stage 16 of Fig. 1, or it may be part of some other stage such as a driver amplifier stage. Audio signals are applied to the signal grid 41*a*, and B+ potential is supplied by conductor 64 to the space charge grid 41*b* and to a tap in the primary winding of a transformer 43. The primary winding of transformer 43 includes winding sections 46 and 47, and a variable resistor 48 couples the section 47 to ground. When the tetrode 41 is conducting, noise signals from the power supply are applied to both sections 46 and 47 of the primary winding, and these noise signals are in phase opposition. When no signal is being applied to the grid 41*a*, the ampere-turns of the winding 46 are substantially equal and opposite to the ampere-turns of the winding 47. Consequently, noise signals from the power supply are cancelled. However, when a signal is being applied to the grid 41*a*, the output signal from the tetrode 41 is applied to the winding section 46 and is not affected by the current in section 47. Thus, the signal fed to the transistor 31 by the transformer 43 is substantially noise free. This signal is amplified in the transistor output stage and is applied through transformer 37 to the loudspeaker 20.

Some noise will be picked up in the transistor output stage from the B+ supply line 65 which is coupled to the emitter 52 and base 53 thereof. Since this noise is not amplified by the output stage, and since it will be covered up to some extent by the desired audio signal, it is not essential that it be removed. During the warm up period for the receiver when no audio signal is being applied to the transistor, however, this noise would be more prominent. Therefore, the diode 38 is interposed in the bias network, composed of the resistors 32, 33, 34 and 35. The diode 38 cuts off the transistor 31 until the tubes of the receiver have warmed up as previously explained, so that no noise is applied to the loudspeaker during the warm up period.

The bias delay circuit may be connected in different ways, one of which is illustrated in the embodiment shown in Fig. 3. The hybrid radio receiver circuit shown here is similar to that shown in Fig. 1 and includes an antenna 10, a radio amplifier stage 11 having a vacuum tube, a converter stage 12 having a vacuum tube, and an intermediate frequency amplifier stage 13 having a vacuum tube. The receiver also includes a detector stage 14, an audio frequency amplifier stage 16, a transistor output amplifier stage 19, and a loudspeaker 20. The diode 15 of the detector stage 14, and the tetrode 17 of the audio frequency amplifier stage 16 are included in the same tube 71. In this embodiment, however, the A.G.C. circuit is coupled to the detector stage 14, and the other diode 38 in the tube 71 is coupled to the bias resistor 35 and provides the warm up silencing action as previously explained. Thus, the invention may be readily incorporated into commonly used receiver circuits without adding an additional tube. The diode 38 could be similarly incorporated into some other tube used in the receiver such as one used in the R.F. amplifier stage 11, or the I.F. amplifier stage 13, and this could be done even if only one of these stages used a tube while the others used transistors.

It may be noted that the receiver circuit shown in Fig. 3 does not include cancellation coils for noise suppression. The transistor output stage 19 is, however, provided with an inverse feedback circuit consisting of the resistor 56 coupled to the collector 54 of the transistor device 31 and to the primary winding of the transformer 43. After the receiver has warmed up, noise appearing in the output of the transistor device is fed back to the input and is reamplified in such a way as tends to cancel some of the original noise. Thus, noise is silenced during the warm up period by the bias delay circuit and is suppressed by the inverse feedback circuit after the warm up period achieving a result which is somewhat similar to that of the circuit shown in Fig. 2. However, the receiver of Fig. 3 using inverse feedback in the output stage 19 only suppresses noise introduced in that stage through the B+ supply line 65, and does not cancel noise introduced through the B+ supply line 64 as does the cancellation circuit of Fig. 2.

The invention provides a hybrid automobile radio receiver which is noise free during the warmup period required by the vacuum tubes used therein. The invention may be used in any receiver using tubes and transistors coupled to a power supply including noise components, and can be used even if only one stage employs a vacuum tube with transistors being employed in the other stages. Furthermore, the diode used in practicing the invention can be provided in the same envelope with other thermionic electron discharge devices so that no expensive components need be added to the receiver.

I claim:

1. A transistor output stage for use in an automobile ratio receiver which includes a plurality of series coupled stages supplied with power having noise components therein from the electrical system of the automobile, and in which the radio receiver includes a thermionic electron discharge device in one of the stages and a signal circuit for supplying received signals to said transistor output stage, said transistor output stage including a transistor device, impedance means coupled to said transistor device and forming a biasing circuit path independent of said signal circuit for applying biasing potential to said transistor device for rendering the same conductive, and thermionic diode means having an anode series coupled to said impedance means and a cathode coupled to a point of reference potential, said diode means having substantially the same warm up characteristics as the aforesaid electron discharge device so that the biasing potential for said transistor device is not applied thereto during the warm up period.

2. A transistor output stage as described in claim 1 in which said thermionic diode means is included in the same tube with the thermionic electron discharge device.

3. In an automobile radio receiver circuit which includes a thermionic electron discharge device supplied with power having noise components from a battery generator voltage source, an output amplifier stage including a transistor device coupled to the voltage source, transformer means coupled to said output amplifier stage and having a primary winding coupled to the voltage source from a tap therein, said primary winding having a first section coupled to the electron discharge device and a second section coupled to a point of reference potential, with said winding sections forming a signal circuit operative to cancel the noise components applied thereto when the thermionic electron discharge device is warmed up, and said transformer means having a secondary winding coupled to said transistor device for applying signals from said signal circuit to said transistor device, impedance means coupled to said transistor device and the voltage source forming a biasing circuit independent of said signal circuit for applying biasing potential to said transistor device rendering the same conductive, and thermionic diode means having an anode coupled to said impedance means and a cathode coupled to a point of reference potential for delaying the application of biasing potential to said transistor device until said diode means is warmed up.

4. A radio receiver for use in an automobile having an electrical system which supplies direct current voltage having superimposed noise components, said radio receiver including in combination, a plurality of signal translating stages coupled in series and including a stage having a thermionic vacuum tube for translating received signals, an output amplifier stage, and a signal circuit for applying signals translated by said vacuum tube to said output amplifier stage, said output amplifier stage including a transistor device having an input portion coupled to said signal circuit and an output portion for supplying amplified signals, a biasing circuit independent of said signal circuit connected to said transistor device, a voltage supplying circuit connected to all of said stages and adapted to be connected to the electrical system of the automobile, said voltage supplying circuit including a switch which applies supply voltage with superimposed noise components to said transistor device when said switch is actuated, said transistor device being capable of translating the noise components of the supply voltage when biased in an effective condition, said vacuum tube being ineffective for a period of time after energization during which said tube warms up so that no received signals are applied to said transistor device during the warm up period, and a thermionic diode connected in said biasing circuit and providing an open circuit for rendering said transistor device ineffective for a period of time during which said diode warms up, said diode and said vacuum tube having substantially the same warm up characteristics so that said tube and said transistor device become effective at substantially the same time and the noise components are not translated by said transistor device during the warm up period.

5. A radio receiver for use in an automobile having an electrical system which supplies direct current voltage having superimposed noise components, said radio receiver including in combination, a plurality of signal translating stages coupled in series and including an audio driver amplifier stage having a thermionic amplifying vacuum tube, and a signal circuit connected to said vacuum tube at which the received signals amplified by said tube are developed, said power amplifier stage including an amplifying transistor device, and means coupled to said signal circuit of said driver amplifier stage and to said transistor device for applying signals from said vacuum tube to said transistor device, a voltage supplying circuit coupled to said vacuum tube and to said transistor device and adapted to be connected to the electrical system of the automobile, said voltage supplying circuit including a switch which applies supply voltage with superimposed noise components to said vacuum tube and said transistor device when actuated, impedance means in said voltage supplying circuit connected to said transistor device for energizing said transistor device after actuation of said switch, said impedance means forming a biasing circuit path independent of said signal circuit of said driver amplifier stage, said transistor device being capable of translating the noise components of the supply voltage when biased in an effective condition, said vacuum tube being ineffective for a period of time after energization thereof during which said tube warms up, and a thermionic diode connected in said biasing circuit path and providing an open circuit which renders said transistor device ineffective for a period of time during which said diode warms up, said diode and said vacuum tube having substantially the same warm up characteristics, whereby said vacuum tube and said transistor device become effective at substantially the same time and the noise components of the supply voltage are not translated thereby during the warm up period.

References Cited in the file of this patent

UNITED STATES PATENTS

| | | |
|---|---|---|
| 2,250,613 | Wiegerinck | July 29, 1941 |
| 2,801,298 | Mital | July 30, 1957 |
| 2,810,071 | Race | Oct. 15, 1957 |

FOREIGN PATENTS

| | | |
|---|---|---|
| 150,232 | Australia | Feb. 23, 1953 |

OTHER REFERENCES

Publication I Rider TV, pp. 2–21, 22, Crosby Model 9–407, 9–407M–1, and 9–407M–2.